United States Patent [19]

Blaser

[11] 4,321,600
[45] Mar. 23, 1982

[54] REMOVABLE LAMP HOUSING FOR OPTICAL ENCODER

[76] Inventor: Anton J. Blaser, 700 E. Mason, Santa Barbara, Calif. 93103

[21] Appl. No.: 178,746

[22] Filed: Aug. 18, 1980

[51] Int. Cl.³ .................... G01D 5/34; G01P 3/36; G08C 19/36
[52] U.S. Cl. .................... 340/870.29; 250/231 SE; 324/175
[58] Field of Search ............... 324/175; 250/231 SE, 250/233, 239; 340/870.29

[56] References Cited

U.S. PATENT DOCUMENTS

| | | | |
|---|---|---|---|
| 2,962,895 | 12/1960 | Rumble | 324/175 |
| 3,693,023 | 9/1972 | Wasserman | 324/175 |
| 4,182,953 | 1/1980 | Hurley et al. | 250/231 SE |

*Primary Examiner*—Thomas A. Robinson
*Attorney, Agent, or Firm*—Ralph B. Pastoriza

[57] ABSTRACT

An optical encoder for providing an electrical signal having a frequency corresponding to the revolutions per minute of a motor shaft comprises a mounting member for securement to the motor, a shutter element for securement to the motor shaft and a top cover secured to the mounting member to sandwich the shutter therebetween. A photo cell is provided on the cover and a lamp housing providing a light source on the mounting member for shining light through the shutter to the photo cell. Rotation of the shutter then modulates the light beam to provide the desired signal. The lamp housing itself incorporates a built-in reflector with light bulb and is so designed as to be replaceable with respect to the mounting member so that heretofore provided lenses and the like are no longer necessary and the mounting arrangement is such that alignment accuracy with the photo cell is assured.

1 Claim, 5 Drawing Figures

REMOVABLE LAMP HOUSING FOR OPTICAL ENCODER

FIELD OF THE INVENTION

This invention relates generally to optical encoders and more particularly to a removable lamp housing structure for facilitating replacement of the light source on such optical encoders.

BACKGROUND OF THE INVENTION

Optical encoders or tachometers are generally well known in the art. Basically, these devices comprise a stationary light source arranged to be mounted on a motor close to the motor shaft. A stationary receiving photo electric cell is provided in alignment with the light source and a rotating shutter secured to the shaft is caused to pass between the light source and photo cell to modulate the light beam to the photo cell. The frequency of output pulses corresponds to the R.P.M. of the motor. In these assemblies, it is vitally important that the light source and photo cell be properly aligned with respect to the rotating shutter in order that usable output pulses are properly generated. Moreover, it is important that sufficient light irradiate the photo cell to assure proper amplitude of pulses.

Accordingly, many presently available encoders provide for a permanent mounting of the light source in order that its position will be consistent in the mounting member portion of the assembly and thus consistent with the position of the photo cell. Further, a lens is usually provided for concentrating the light on the photo cell. However, where it is necessary to replace the light bulb or other light source, it cannot be assured that the light will be radiated in precisely the same direction towards the photo cell as was the case before. Primarily, the problem involved is that of the lamp filament itself which position may vary and thus vary the concentration of the light. Such concentration of the light is accentuated by the lens so that any misalignment of the lamp with the lens is exaggerated. Further, removal of the lens is necessary to replace the light bulb and in replacing the lens, consistency is not always assured so that the entire operation becomes somewhat of a burden if effective operation is to be assured after replacement of the light bulb.

BRIEF DESCRIPTION OF THE PRESENT INVENTION

With the foregoing considerations in mind, the present invention contemplates the provision of an entire lamp housing which can be removed from the mounting member of the encoder and replaced with an entirely new lamp housing. The result is an assurance of consistent positioning of the light source relative to the photo cell so that alignment problems and the like heretofore involved with prior art structures are avoided.

Briefly, the present invention contemplates the provision in an optical encoder of a lamp housing including a built-in reflector and permanently secured light emitting means positioned at the focus of the reflector. The lamp housing is completed by the provision of coupling means cooperating with the mounting member of the encoder permitting replacement of the entire lamp housing in the mounting member. By this arrangement, the reflector and light bulb together with the lamp housing are replaced as an entire unit so that alignment problems formerly causing difficulties in the prior art are wholly avoided. Further, by providing the built-in reflector, there is no necessity for a separate lens and thus a separable component heretofore thought necessary has been eliminated.

BRIEF DESCRIPTION OF THE DRAWINGS

A better understanding of this invention will be had by now referring to a preferred embodiment thereof as illustrated in the accompanying drawings in which.

DETAILED DESCRIPTION OF THE PREFERRED EMBODIMENT

Figure 1:
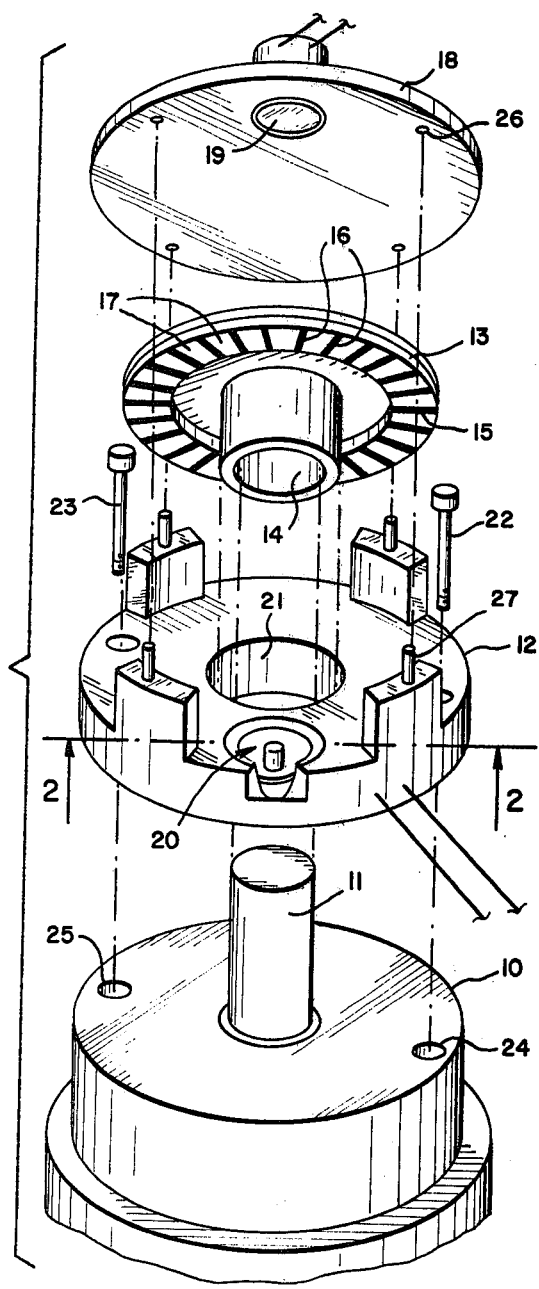
FIG. 1 is a fragmentary exploded perspective view of the encoder of the present invention preparatory to being assembled on a motor.

Referring first to the lower portion of FIG. 1, there is shown the upper portion of a motor casing 10 having an output shaft 11 for the motor projecting generally upwardly. The optical encoder of the present invention is designed to provide an output signal of frequency proportional to the R.P.M. of the motor shaft 11. This optical encoder shown in exploded view includes a mounting member 12 arranged to be secured to the motor casing 10 and a disc shaped shutter 13 having a central shaft 14 for securement to the motor shaft 11 so that the shutter 13 will rotate relative to the mounting member 12.

As shown in FIG. 1, the shutter 13 has a periphery 15 defining alternate dark and light areas 16 and 17 in a circumferential direction.

The assembly is completed by the provision of a cover member 18 carrying a photo cell 19 on a peripheral portion thereof. Cover 18 is arranged to be secured to the mounting member 12 so that the shutter 13 is sandwiched therebetween. A removable lamp housing is indicated generally by the numeral 20 on the mounting member 12 and is in alignment with the photo cell 19 so that the periphery 15 of the shutter passes between the photo cell and the lamp housing to modulate light passing from the housing to the photo cell as the shaft 11 rotates.

In the particular embodiment illustrated, the mounting member 12 has a central opening 21 of larger diameter than the shaft 11 so that the mounting 12 is wholly out of physical contact with the shaft 11. Securement of the mounting member 12 to the casing 10 is accomplished by appropriate screws 22 and 23 passing through spaced points on the periphery of the member 12 into tapped openings 24 and 25 in the motor casing 10.

Securement of the cover member 18 to the mounting member, in turn, is accomplished by means of appropriate openings such as indicated at 26 in the cover member periphery and dowel pins such as indicated at 27 on the mounting member 12. The provision of the openings and dowel pins assures proper alignment of the photo electric cell 19 with the lamp housing 20 so that under normal conditions, light emitted from the lamp housing 20 will pass to the photo cell 19.

In prior art encoders, there was not provided a lamp housing 20 in the mounting member 12 but rather simply a light source such as a light bulb together with a cooperating lens for focusing light from the light bulb upwardly towards the photo electric cell 19. When it was necessary to replace the light bulb, the lens had to be removed and the light bulb itself unthreaded or otherwise unplugged from a socket. Replacement of a new light bulb and lens would not always result in the emitted light being in precisely the same direction as in the earlier case primarily because of different physical shapes for filaments, and difficulty in consistently repositioning the lens.

As mentioned heretofore, the foregoing problems are cured in accord with the present invention by the provision of the lamp housing 20 which will now be described in greater detail with respect to FIG. 2.

Figure 2:
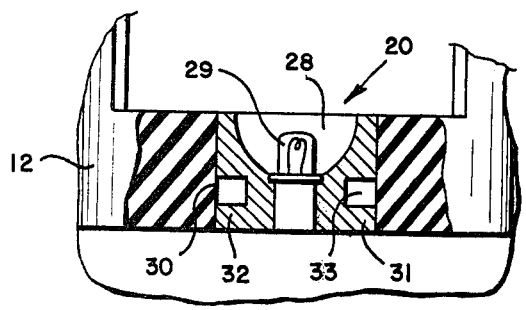
FIG. 2 is a fragmentary cross section taken in the direction of the arrows 2—2 of one of the basic components of the encoder of FIG. 1.

Referring specifically to FIG. 2, it will be noted that this lamp housing includes a parabolic reflector 28 together with a permanent light bulb or light emitting diode 29 positioned at the focus of the parabolic reflector 28. The reflector avoids the necessity of any type of lens and is always consistently positioned with respect to the light source 29 so as to direct light in a desired direction.

Lamp housing 20 further includes a cylindrical base 30 with radially extending tabs on its lower portion as viewed in FIG. 2 indicated at 31 and 32. This cylindrical base portion 30 with the tabs 31 and 32 is receivable in an opening 33 formed in the mounting member 12.

Figure 3:
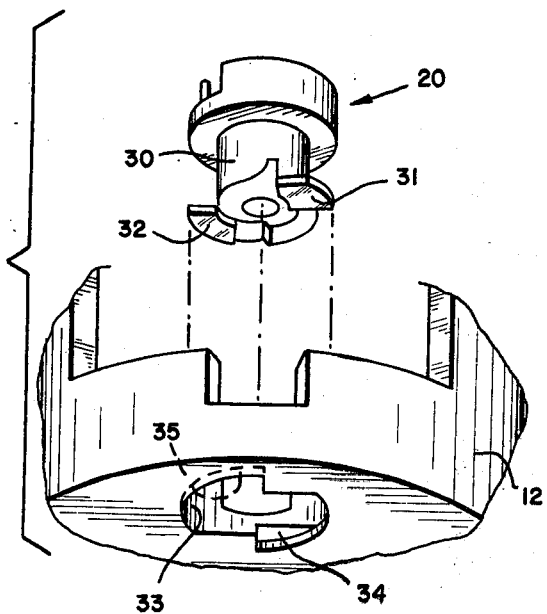
FIG. 3 is an exploded fragmentary perspective view of the components illustrated in FIG. 2.

Referring now specifically to the exploded view of FIG. 3 which illustrates the lamp housing 20 separated from the mounting member 12, it will be noted that the opening 33 includes ledge portions 34 and 35 respectively circumferentially spaced from the tabs 31 and 32 when the cylindrical base 30 and tabs are first inserted into the opening 33; that is, when the lamp housing is in a first rotated position.

Figure 4:
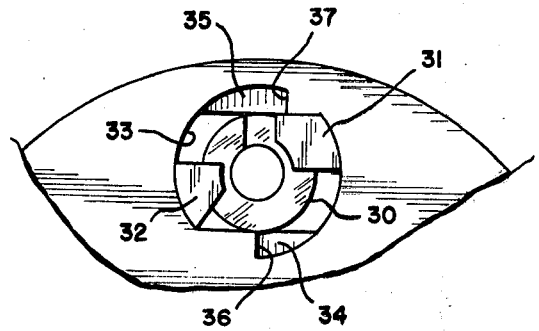
FIG. 4 is an underside fragmentary plan view of the components of FIG. 3 in assembled relationship in a first rotated position; and, FIG. 5 is a view similar to FIG. 4 but showing the components in a second rotated position.

The foregoing first rotated position is illustrated best in FIG. 4 looking at the underside of the components of FIG. 3 in assembled relationship. It will be noted that the tabs 31 and 32 along with the cylindrical portion 30 have been received in the opening 33 in circumferentially spaced relationship with respect to the ledges 34 and 35.

Figure 5:
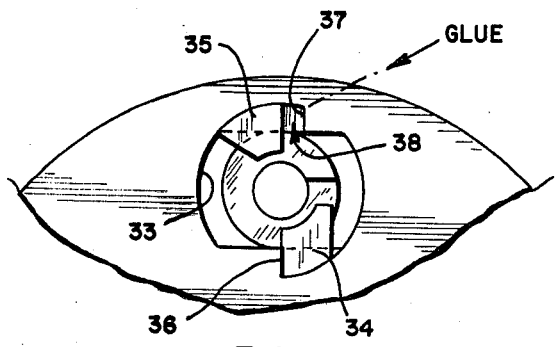

Now the entire lamp housing including the base portion 30 is rotated to a second rotated position, the tabs 31 and 32 seating respectively on the ledges 34 and 35, this second rotated position being depicted in FIG. 5.

It will be noted in both FIGS. 4 and 5 that the ledges 34 and 35 are provided with indexing end stops 36 and 37. One of these end stops 36 engages in full surface contact the tab 34 when the lamp housing is in its second rotative position with the tabs 31 and 32 fully seated on the ledges. The other end stop 37, on the other hand, is in spaced relationship with respect to tab 35 to define therewith a channel shown at 38 in FIG. 5.

This channel serves to define a small space for receiving a drop of glue or equivalent adhesive to secure the lamp housing in the mounting member 12.

With the foregoing arrangement, it is very easy to replace the lamp housing simply by breaking the one small portion of glue in the channel 38 and thence rotating the entire housing from its second rotated position back to its first rotated position illustrated in FIG. 4. The lamp housing can then simply be lifted out of the mounting member 12 and replaced with an entirely new lamp housing.

By providing the new or substitute lamp housing with a lamp and reflector in precisely the same geometrical relationship in every way as was the first lamp and reflector, when the second lamp housing is inserted and locked in position in the mounting member, there will be assured absolute consistency in the direction of travel of light therefrom to the photo cell.

The parabolic reflector serves to emit a proper focused beam of light to the photo cell for maximum illumination and thus maximum amplitude output signal. Since the parabolic reflector and light emitting diode or light bulb itself always remain fixed as they are manufactured as a unit, alignment problems associated with prior art structures are wholly avoided.

From all of the foregoing, it will thus be evident that the present invention has provided an improved optical encoder wherein the provision of the removable lamp housing enables consistent positioning of the light source when replacing the same and thus adds to the life and value of the optical encoder itself.

I claim:

1. An optical encoder for mounting on a motor casing and shaft for generating an output signal of frequency proportional to the revolutions per minute of the motor shaft, including in combination:
   (a) a mounting member for securement to said motor casing;
   (b) a disc shaped shutter having a central hub for securement to said shaft and a periphery defining alternate dark and light areas in a circumferential direction;
   (c) a top cover secured to said mounting member in a position to overlie at least a portion of the periphery of said shutter such that said portion of said periphery is sandwiched between a portion of the top cover and a portion of the mounting member;
   (d) a photo cell in said portion of said top cover; and
   (e) a lamp housing including a reflector and lamp on said portion of the mounting member for passing light up through said portion of the periphery of said shutter to said photo cell so that rotation of the shutter with the motor shaft modulates the light passing through the shutter to the photo cell, said housing having a cylindrical base with radially extending tabs, said portion of said mounting member defining an opening receiving said cylindrical base in a first rotated position and defining ledge portions circumferentially spaced from said tabs in positions to receive and seat said tabs when said housing is rotated in said opening to a second rotated position, one of said ledges having an end stop indexing rotation of said housing to said second rotated position in which said tabs are fully seated in said ledges, the other of said ledges having an end stop spaced from its associated tab when the housing is in said second rotated position to define a channel, whereby glue can be received in said channel to lock said housing in place in said mounting member and yet later removed if necessary to enable removal and replacement of said housing.

* * * * *